United States Patent [19]
Dingremont

[11] Patent Number: 5,595,612
[45] Date of Patent: Jan. 21, 1997

[54] WORKPIECE WITH WEAR RESISTANCE COATING

[75] Inventor: Norbert M. Dingremont, Vandoevre les Nancy, France

[73] Assignee: Balzers Aktiengesellschaft, Furstentum, Germany

[21] Appl. No.: 93,361

[22] Filed: Jul. 19, 1993

[30] Foreign Application Priority Data

May 27, 1993 [CH] Switzerland ............... 1599/93

[51] Int. Cl.[6] ............... C23C 8/22; C23C 8/26; C23C 30/00
[52] U.S. Cl. ............... 148/318; 148/319; 428/627; 428/660; 428/681
[58] Field of Search ............... 148/316, 317, 148/318, 319, 326, 328; 428/627, 660, 681

[56] References Cited

U.S. PATENT DOCUMENTS

| | | | |
|---|---|---|---|
| 4,698,272 | 10/1987 | Inokuti et al. | 428/627 |
| 5,187,017 | 2/1993 | Hatano et al. | 148/318 |
| 5,254,181 | 10/1993 | Yoshino et al. | 148/318 |

FOREIGN PATENT DOCUMENTS

| | | | |
|---|---|---|---|
| 0093706 | 11/1983 | European Pat. Off. | 148/318 |
| 2528255 | 2/1976 | Germany | 428/627 |
| 3445166 | 6/1986 | Germany | 428/627 |
| 58-31066 | 2/1983 | Japan | 148/318 |
| 58-130255 | 8/1983 | Japan | 148/318 |
| 59-83761 | 5/1984 | Japan | 148/318 |
| 8602385 | 4/1986 | WIPO | 148/316 |

*Primary Examiner*—Deborah Yee
*Attorney, Agent, or Firm*—Notaro & Michalos PC

[57] ABSTRACT

A workpiece is made of a steel body and has a hard material coating thereon. The surface which receives the hard material coating is enriched with at least one of C, N, B, O, S or Si. A transition zone between the enriched surface area and the hard material coating has a non-diminishing content of the at least one element.

3 Claims, 3 Drawing Sheets

WORKPIECE WITH WEAR RESISTANCE COATING

BACKGROUND OF THE INVENTION

1. Field of the Invention

The present invention is directed to a method for increasing wear resistance of a workpiece surface which has been provided with a converted layer and to such a workpiece with improved wear resistance.

2. Description of Prior Art

For a great variety of workpieces, as e.g. for forming tools, it is advantageous to subject their surfaces to a surface treatment, thereby forming a converted layer. This may e.g. be done by a thermo-chemical treatment or by vacuum plasma treatment. This treatment will be referred to as "annealing" and is meant to include such thermo-chemical or vacuum treatments.

On the other hand, for a multitude of workpieces, a coating of their surfaces with a hard material layer is advantageous for increasing their wear resistance.

Up to now, it has only been possible to a very restricted extent to combine these two methods. In spite of the fact that here and there positive results were reported, the pre-annealed and thereafter hard material coated workpieces showed in practice binding problems with respect to the hard material coatings which resulted in that, at least locally, hard coating disruptures occurred with a respective loss of hard coating along surfaces of such combined treated workpieces during their practical use.

If there is applied on an annealed surface, annealed e.g. thermo-chemically or by vacuum treatment, as for instance by a physical vapor deposition process, a hard material, wear resistance layer, there is formed along the annealing layer a thin layer whereat the content of semi-metal of the annealing layer, which is characteristic for such an annealing layer, is lowered to show a significant lack of semi-metal content.

We understand under semi-metals especially the elements C, N, B, O, S, Si, but not exclusively.

This thin layer with lack of semi-metal content, which shall be named "intermediate layer", shows only a small tension and shearing strength. It is due to this intermediate layer that the applied hard material layer is either sheared off during practical use or peels off due to pressure tension inherently prevailing in the hard material coating. Nevertheless, it must be admitted that this drawback does not always occur. It appears that some method and material combinations exist, whereat this phenomenon of badly adhering hard material layer may not be observed, at least not as pronounced as was described. Nevertheless, the mere fact that these problems do occur at most method and material combinations is a tremendous drawback for refining workpieces, e.g. in a refining centre, where a great variety of different workpieces is to be treated.

Up to now, the attempts to resolve the said problem of badly adhering hard material coating were limited on reducing the temperature during hard material coating, e.g. below 300° C. At such low temperatures it is nevertheless not possible to deposit hard material layers with a sufficient adherence by known physical vapor deposition processes (PVD).

SUMMARY OF THE INVENTION

It is an object of the present invention to provide a method of hard material coating a workpiece surface, which is provided with a converted or annealing layer, so that the adherence of the hard material coating is ensured. This is resolved by a method for increasing the wear resistance of workpiece surfaces which surface has been converted or annealed to form an annealing layer thereon, which method comprises vacuum plasma etching the surface of the annealing layer and applying a hard material coating thereon, thereby performing the vacuum plasma annealing step so that after applying said hard material layer the said annealing layer has a predetermined concentration of semi-metal.

By the inventive step of controlling by means of the said vacuum plasma etching step, the concentration of semi-metal especially along the surface of the annealing layer, it is reached that this concentration may be adjusted so that it does not fall below a predetermined value after the hard material coating having been applied.

Principally, the concentration of semi-metal at said annealing layer may be increased by said vacuum plasma etching step or may be maintained constant or may be lowered, according to a concentration, which is considered optimal for the adherence of the post-applied hard material coating and, according to the concentration of semi-metal, which is already prevailing at the annealing layer.

It is a further object of the present invention to control the semi-metal concentration of the annealing layer especially at its surface by vacuum plasma etching with respect to at least one of the semi-metals C, N, B, O, S, Si.

In a preferred mode of operation, the vacuum plasma etching process is performed in a reactive gas atmosphere which, in a further preferred form of operation, contains a reactive gas which comprises the semi-metal which forms the annealing layer together with the workpiece bulk material. In spite of the fact that in some cases it is quite possible that the annealing layer comprises one semi-metal and that, by means of the reactive etching process, a second semi-metal is introduced, it has been shown that, in a preferred mode of operation and as was mentioned, the reactive vacuum plasma etching process is performed in a gas atmosphere which comprises the same semi-metal, at least to a predominant part, which forms, possibly together with other semi-metals, the said annealing layer together with the workpiece bulk material, It is a further object of the invention to perform the said method in a preferred form at workpieces which have been annealed by a thermo-chemical or by a vacuum plasma surface treatment.

It is a further object of the present invention to provide a method for increasing the wear resistance of workpieces which may be performed as economically as possible. This is realized by performing at least two of the steps of annealing, plasma vacuum etching and of hard material layer deposition in situ, i.e. within the same vacuum recipient.

In a preferred mode of realization, the step of hard material coating is performed by means of a reactive plasma enhanced process, so especially by means of a physical vapor deposition process. Under this expression, PVD process, e.g. reactive sputter coating, reactive evaporation coating, the latter by means of reactive arc evaporation or reactive electron beam evaporation or reactive evaporation by means of a low voltage discharge, shall be understood and especially ion plating or ion beam sputtering. Principally other plasma enhanced deposition processes may be used, so e.g. plasma enhanced chemical vapor deposition (PECVD) or other PVD/CVD hybrid process forms.

In a preferred form, the inventive method is performed on workpieces whereat the annealing layer has been formed by boriding, carbonizing, nitro-carbonizing, carbo-nitriding, oxy-nitriding, oxy-carbo-nitriding or oxy-nitro-carbonizing, thereby, in an especially preferred form by nitriding. Thereby, any known methods for generating such annealing layers may be used, but, as was mentioned, in a preferred form either thermo-chemical or vacuum plasma surface treatment.

In spite of the fact that as a hard material coating any of the known hard material coatings for wear resistance increase may be applied, so e.g. a chromium and molybdenum disulphide layer or a diamond or diamondlike layer, in a preferred form of the inventive method, the hard material layer is applied as a boride, nitride, carbo-nitride (carbonitride), carbonide, nitro-carbonide (nitrocarbonide), oxy-nitride (oxinitride), oxy-carbonide (oxicarbonide), oxy-nitrocarbonide (oxinitrocarbonide), thereby, in a further preferred mode, from a metal of the group IVb or from an alloy with at least one of these metals, defined according to the "CRC Handbook of Chemistry and Physics", 54th edition Robert C. Weast. In a preferred mode, this metal especially comprises at least one of Ti, Zr, Hr.

With respect to an example for providing the annealing layer, we draw the attention to the U.S. Pat. No. 4,762,756 which is incorporated by reference to the present description.

In a further preferred mode of operating the inventive method, the plasma vacuum etching process is so performed that the concentration of semi-metal of the annealing layer and especially along its surface is maintained unchanged after the hard material layer has been applied.

In a most preferred mode of operation for controlling the said concentration of semi-metal in the annealing layer, the amount of reactive gas consumed during the time-span of the etching process is used as variable for optimizing the quality of the hard material layer which is afterwards to be applied.

Thereby, in a further preferred mode of operating the etching step, the latter is only started when a predetermined partial pressure of reactive gas is reached and/or the workpiece temperature lays below a predetermined value.

The inventive method is further preferably performed on forming tools or on cutting tools or, generally, on workpieces of steel bulk material.

BRIEF DESCRIPTION OF THE DRAWINGS

The present invention will be better understood and objects other than those set forth above will become apparent when consideration is given to the following detailed description. Such description makes reference to the annexed drawings and to an example.

The annexed drawings show.

DESCRIPTION OF PREFERRED MODE

Figure 1:
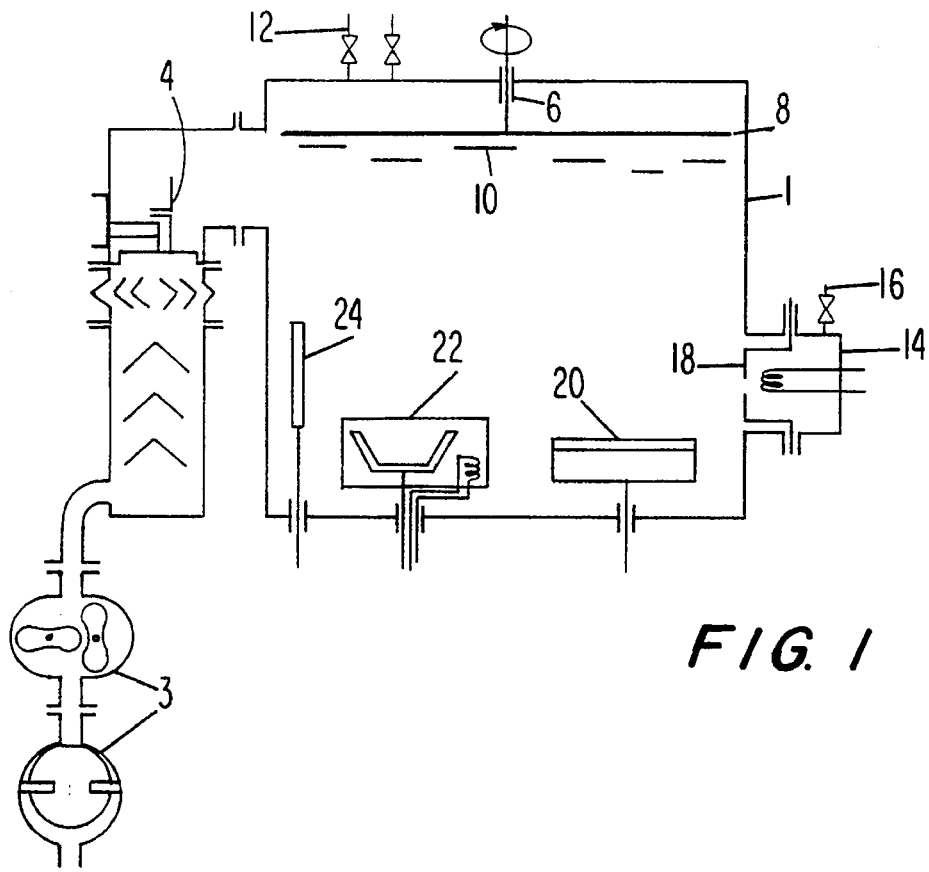
FIG. 1 a schematic cross-section of a vacuum treatment chamber, wherein the inventive method is performed, as an example.

According to FIG. 1, a vacuum apparatus, which may be used to perform the inventive method, comprises a vacuum chamber 1. Vacuum pumps 3 are linked to the chamber 1 via a controllable throttle valve 4. A workpiece carrier 8 is rotatably mounted by means of a feed-through rotational mount to the wall of the chamber 1 by means of which the workpiece carrier 8 may be electrically fed with a controllable biasing voltage. Behind the workpiece carrier 8 with schematically shown workpieces 10, inlets 12 for a gas are arranged.

There is further provided a hot cathode chamber 14 with gas inlet 16, which chamber 14 is mounted to the vacuum chamber 1 and communicates, as schematically shown, via an orifice arrangement 18 with its inside. Further, the apparatus comprises, within chamber 1, a planar magnetron sputter source 20 as well as an electron beam evaporator arrangement 22 and an auxiliary anode 24.

An apparatus of this configuration is known and is used and sold by the applicant of the present invention as type BAI640R apparatus. The pumping power of the oil diffusion pump and the rolling piston pump is about 800 l/sec.

Probes of Z38CDV-5 and of 35NCD-16 steels were treated by different thermo-chemical pretreatments to result in differently nitrided workpiece surfaces, i.e. in different nitride converted or annealing layers. This to install a set of different annealing layers as varying initial condition for the inventive method. Thus, as well the parameters of the annealing layer as well as, afterwards, those of hard material coating, after etching step, were systematically varied. Previous to the etching step a heating step of the workpieces was performed which is optional.

Astonishingly, it was recognized that the hard material coating shows only then completely satisfying quality when the amount of reactive gas consumed during the reactive vacuum plasma etching step, and thus the amount of reactive gas inlet to the vacuum chamber during said etching step, lays within a predetermined relatively narrow band of values, dependent from the type of annealing layer (nitride, boride etc.) and from the type of steel, but independent from the kind of the subsequent hard material coating (nitride, carbo-nitride etc.). This for a wide range of parameters for the annealing layer, thus e.g. of the thermo-chemical pretreatment, as well as of the subsequent heating step and thereby especially of the workpiece temperature, as well as of the subsequent methods used for applying the hard material coating.

Therefrom it was recognized that by well controlled adjustment of the concentration of semi-metal at the annealing layer, in spite of the following hard material layer deposition, optimal conditions may be reached by which especially the occurrence of an intermediate layer with reduced concentration may be prevented.

EXAMPLE

I. Surface pretreatment as initial condition
Realization of the annealing layer
a) A first set of probes and tools made of steel 35NCD16 was first nitrided within a conventional triode plasma nitriding chamber. There resulted only a diffusion layer at the surface. The following conditions were set:

TABLE 1

| | |
|---|---|
| workpiece temperature | 570° C. |
| gas mixture | hydrogen with 3% nitrogen |
| pressure | 266 Pa |
| treatment duration | 4 hours |
| total workpiece surface | 200 cm$^2$ |
| plasma discharge voltage | 700 V |
| plasma discharge current | 0.65 A |

Under these conditions there resulted a nitriding depth of 125 μm with a hardness of 530HV$_{0.1}$ at 25 μm of depth.

b) A second set of probes and tools was treated by the said diode nitriding chamber so that there resulted a layer of γ'/Fe$_4$N above the diffusion layer. The conditions were:

TABLE 2

| | |
|---|---|
| workpiece temperature | 550° C. |
| gas mixture | hydrogen with 8% nitrogen |
| pressure | 266 Pa |
| treatment duration | 4 hours |
| total workpiece surface | 200 cm$^2$ |
| nitrogen flow | 26 scc/min |
| plasma discharge voltage | 650 V |
| plasma discharge current | 0.65 A |

Under these conditions there resulted a nitriding depth of 170 μm with a hardness of 600HV$_{0.1}$ at 25 μm depth.

For tools made of steel Z38CDV5 (DIN 1,2343), the same conditions, but with treatment duration of 16 hours led to a nitriding depth of 150 μm and a hardness of 1200HV$_{0.1}$ at 25 μm depth.

c) A third set of probes and tools was treated in the same diode nitriding arrangement so that there resulted on the surfaces a layer of ε-Fe$_{2-3}$ (CN) above the diffusion layer. The conditions were:

TABLE 3

| | |
|---|---|
| workpiece temperature | 550° C. |
| pressure | 266 Pa |
| hydrogen flow | 46.6 scc/min |
| nitrogen flow | 276 scc/min |
| methane flow | 10 scc/min |
| treatment duration | 4 hours |
| total workpiece surface | 200 cm$^2$ |

TABLE 3-continued

| | |
|---|---|
| plasma discharge voltage | 500 V |
| plasma discharge current | 0.7 A |

Under these conditions there resulted a nitriding depth of 170 μm with a hardness of 700HV$_{0.1}$ at 25 μm depth. For tools made of steel Z38CDV5 (DIN 1,2343) the same conditions, but with a treatment duration of 16 hours led to a nitriding depth of 150 μm and a hardness of 1300HV$_{0.1}$ at 25 μm depth.

II. Inventive treatment of the annealed surfaces a) Heating

Figure 2:
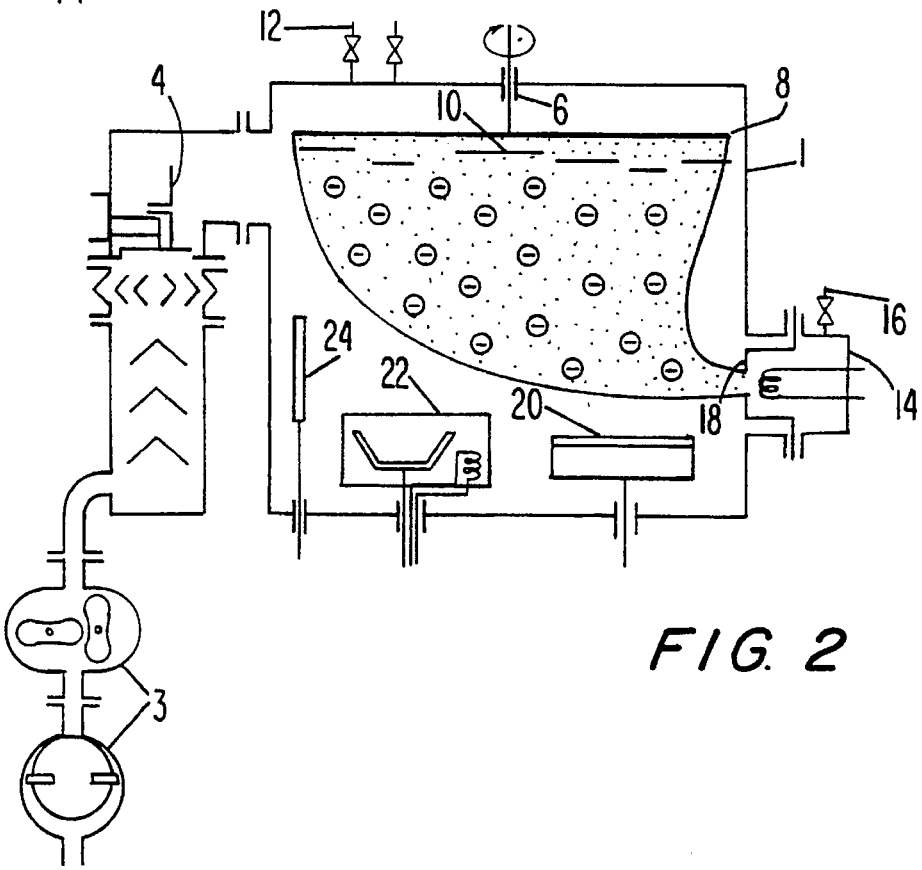
FIG. 2 the chamber according to FIG. 1, which is operated so as to preheat the inventively treated workpieces before their etching.

The differently annealed probes and tools were first heated in a neutral plasma in the chamber according to FIG. 2 on 470° C.

This heating may be performed, as an example, as disclosed in the U.S. Pat. No. 4,555,611 or the DE-A-34 06 953 or the FR-A-1 153 552 which are, with respect to heating, integrated by reference to the present description.

b) Etching

Figure 3:
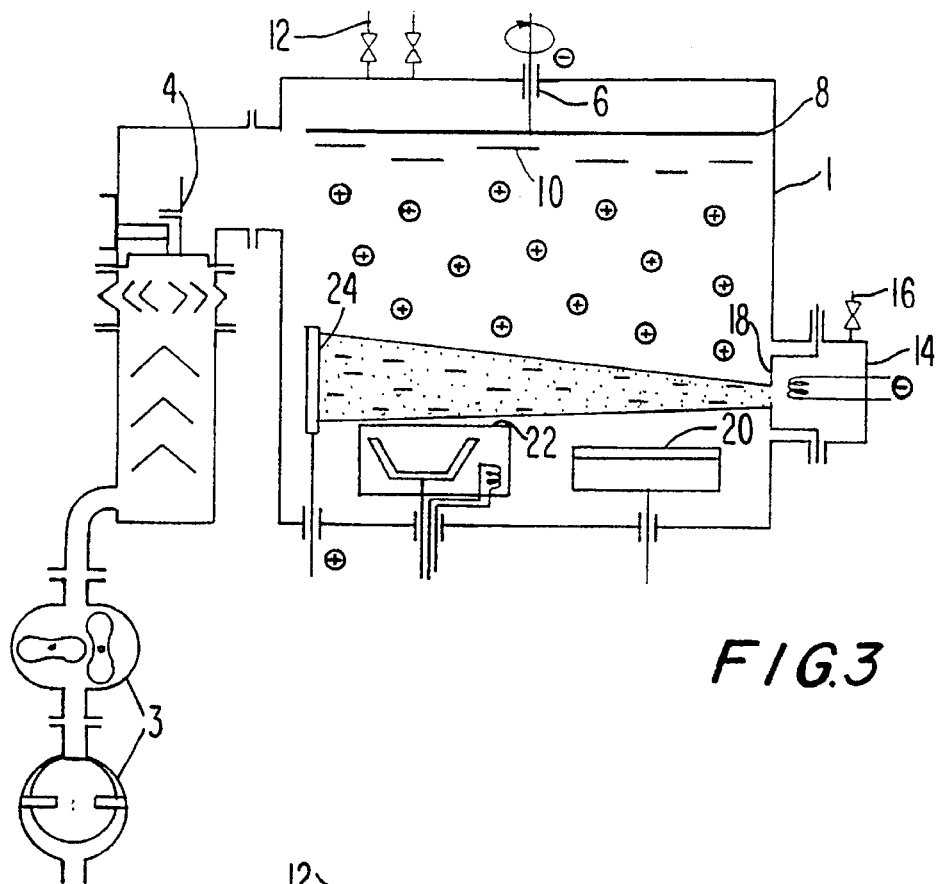
FIG. 3 the treatment chamber according to FIG. 1, which is operated for reactive plasma etching of the converted workpiece surfaces.

In the following table the etching parameters for experiments 1 to 6 are listed, which experiments were performed on all differently annealed and heated probes and tools. The operation of the apparatus according to FIG. 1 for performing etching is shown in FIG. 3.

From that table it becomes evident that for all prenitrided workpieces, thus largely independent from the kind of preapplied annealing layer, then a perfectly adhering collar-free, smooth hard coating could be reached if, during the etching process duration, 5 sccm nitrogen was fed to the chamber at a nitrogen partial pressure of 0.02Pa. Therefrom it is further evident that principally the parameter "consumed and thus inlet reactive gas amount during the etching process duration" is the optimizing variable of the etching process for the adherence of the post-applied hard material layer. Thereby, the consumption of reactive gas during the etching process is a significant entity governing the adjustment of the optimal reactive gas amount during said process. Adjustment of the amount of inlet reactive gas is substantially dependent from the extent of simultaneously etched workpiece surface.

According to the following table there resulted for a total workpiece surface of 0.15m$^2$ an optimal nitrogen amount of 5sccm. For a total surface of 1m$^2$ there results an optimal amount of 25sccm.

TABLE 4

| parameter | experiment 1 | experiment 2 | experiment 3 | experiment 4 | experiment 5 | experiment 6 |
|---|---|---|---|---|---|---|
| argon pressure | 0.12 Pa | | | | | |
| nitrogen partial pressure | " | .004 Pa | 0.02 Pa | 0.02 Pa | .032 Pa | 0.04 Pa |
| nitrogen flow: scc/min | " | 1 | 5 | 5 | 8 | 10 |
| workpiece surface | .15 m$^2$ | | | | | |
| plasma discharge current | 160 A | | | | | |
| workpiece bias voltage | −200 V | | | | | |
| workpiece current | 1.5 A | | | | | |
| workpiece temperature | 400° C. | | | | | |
| duration: min | 10 | 10 | 10 | 15 | 10 | 10 |
| result | | formation of a black collar below the titanium nitride layer | | perfectly adhering collar-free smooth titanium nitride | | no collar, but the hard material layer is rough, porous and powdery |

TABLE 4-continued

| parameter | experiment 1 | experiment 2 | experiment 3 | experiment 4 | experiment 5 | experiment 6 |
| --- | --- | --- | --- | --- | --- | --- |
| behaviour of the coated tools | | bad | hard material layer perfect | | bad | |

For etching which is started by applying a negative voltage to the workpieces with respect to plasma potential, it is important that already at the beginning of this etching at least a minimal partial pressure of the respective reactive gas is adjusted. Preferably the said partial pressure of e.g. 0.02Pa for the etching process defined according to table 4 for nitrogen is installed already shortly before etching starts, i.e. before the workpieces are controlled on a negative DC potential. The etching step may be performed by DC or by AC etching or, as a hybrid form, with the help of a mixed AC + DC plasma. According to FIG. 3, there was here applied DC plasma etching.

c) Hard material coating, results

Figure 4:
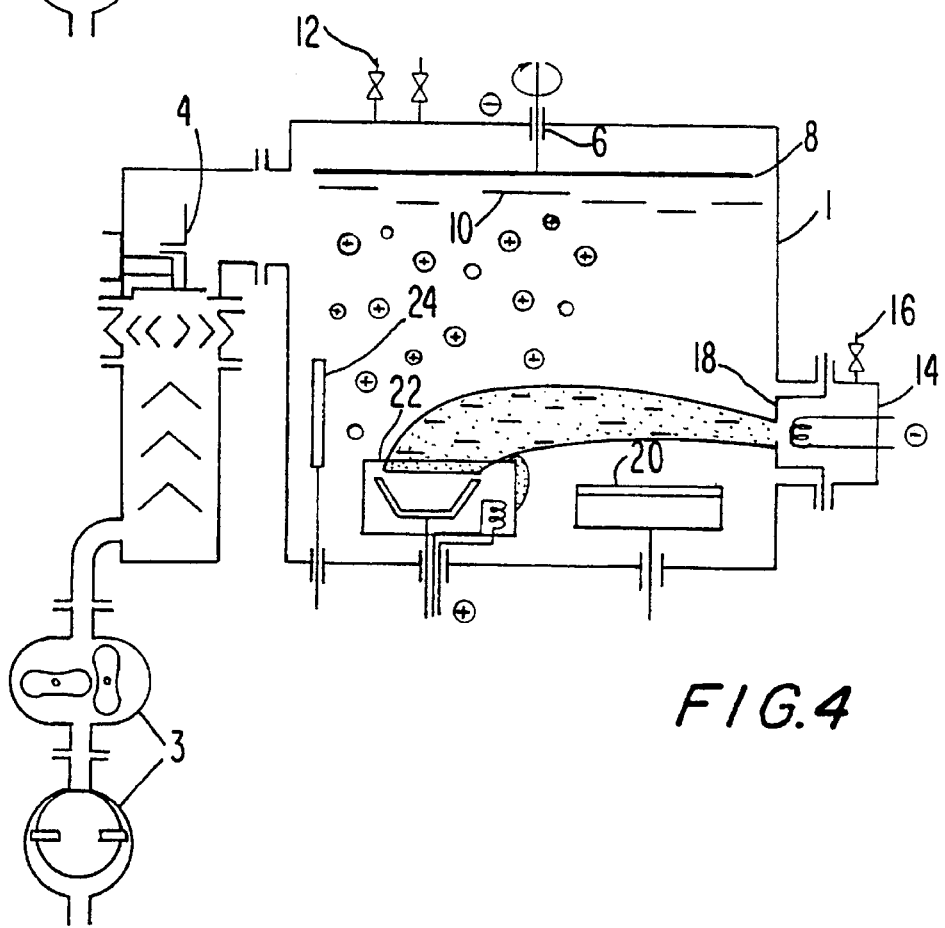
FIG. 4 a vacuum chamber according to FIG. 1, which is operated to apply the hard material layer by ion plating which occurs after vacuum plasma etching of the converted surface.
Figure 5:
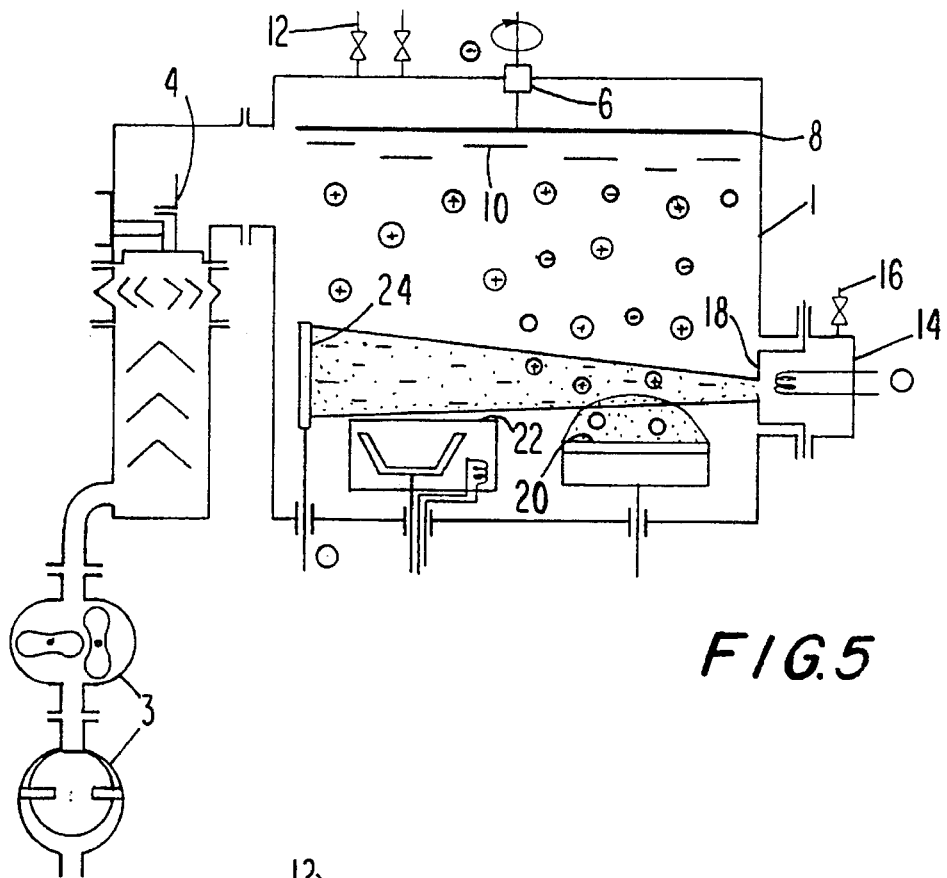
FIG. 5 a vacuum treatment chamber according to FIG. 1, which is operated for applying the hard material layer by ion enhanced sputter coating after reactive plasma etching having been performed on the converted layer.
Figure 6:
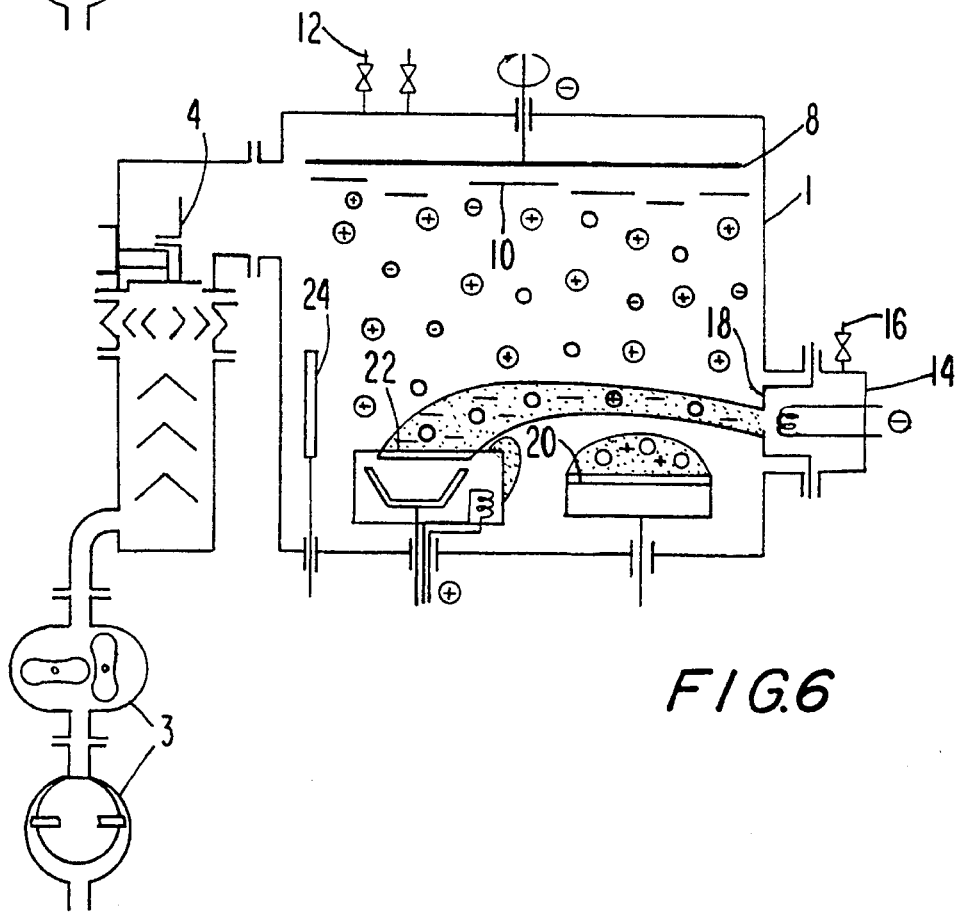
FIG. 6 the chamber according to FIG. 1 for applying the hard material layer by means of a hybrid process which comprises ion plating and ion enhanced sputter coating.

After etching, the probes and tools were hard material coated, partly by ion plating — operation of the apparatus according to FIG. 4, partly by ion enhanced sputter coating — operation of the apparatus according to FIG. 5, partly by a hybrid operation of the apparatus according to FIG. 6. By operation according to the FIGS. 4 and 5 the substrates (tools and probes) were coated with a titanium nitride hard material layer with a thickness of 4.5 μm.

The forming tools, coated as described, show a significantly improved life-time under operating conditions, compared with untreated forming tools with uncoated, only preannealed forming tools and with forming tools directly hard material coated with a 4.5 μm titanium nitride layer, but not preannealed. Further, the operating times for tools, which had been etched according to the experiments 1, 2, 4 to 6, according to table 4, were significantly lower than the operating life-times of the tools etched according to the parameters of experiment 3.

Further experiments with other steels and other nitriding methods resulted in the fact that deposition of a well adhering ring hard material layer with a good structure will always then be reached when the thermo-chemical conditions during the etching step prevent occurrence of an intermediate layer at the diffusion layer which lacks of semi-metal for a specific type of steel considered. Realization of a diffusion layer without intermediate layer lacking of semi-metal is inventively reached, as was mentioned, by accordingly adjusting the thermo-chemical conditions during the etching step, thereby especially by controlled adjustment of the consumed and thus inlet amount of reactive gas during the etching process. Also for other surface annealing processes than nitriding, so e.g. for boriding, carbonizing, nitro-carbonizing, carbo-nitriding, oxy-nitriding, oxy-carbonitriding, oxy-nitro-carbonizing, it was recognized that the inventive method is valid. In further experiments, after the described plasma etching, other hard material coatings, e.g. by operating the apparatus according to FIG. 6, were realized, as e.g. of chromium and of molybdenum disulphide, deposited on prenitrided steel. Here, too, significantly improved life-times under operating conditions were found for the tools and probes subjected to this coating.

I claim:

1. A workpiece comprising: a steel body made of a steel body material and having a surface area with a hard material coating thereon which is formed of a metal of the group IVb or of a metal alloy with at least one of said metal of the group IVb, the surface area of the steel body whereon the hard material coating resides, being enriched, with respect to the steel body material, with at least one element from the group C, N, B, O, S, and Si; and a transition zone extending from said enriched surface area of the steel body into the hard material coating having a non-diminishing content of said at least one element when considered in a direction from an interior of the steel body, toward the hard material coating which contains the metal of group IVb or alloy thereof.

2. The workpiece of claim 1, wherein the hard material coating comprises at least one of a boride, nitride, carbonide, nitrocarboride, carbonitride, oxinitride, oxicarbonitride, and oxinitrocarbonide of the group IVb metal or alloy.

3. The workpiece of claim 1, being a forming or cutting tool.

* * * * *